United States Patent
Lin et al.

(10) Patent No.: US 9,281,333 B2
(45) Date of Patent: Mar. 8, 2016

(54) SOLID-STATE IMAGING DEVICES HAVING LIGHT SHIELDING PARTITIONS WITH VARIABLE DIMENSIONS

(71) Applicant: VisEra Technologies Company Limited, Hsin-Chu (TW)

(72) Inventors: Chi-Han Lin, Zhubei (TW); Chih-Kung Chang, Hsinchu County (TW); Hsin-Wei Mao, Hsinchu (TW)

(73) Assignee: VisEra TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/267,480

(22) Filed: May 1, 2014

(65) Prior Publication Data

US 2015/0318320 A1 Nov. 5, 2015

(51) Int. Cl.
*H01L 27/146* (2006.01)

(52) U.S. Cl.
CPC .... *H01L 27/14623* (2013.01); *H01L 27/14621* (2013.01); *H01L 27/14625* (2013.01); *H01L 27/14627* (2013.01)

(58) Field of Classification Search
USPC ........................................................ 257/232
See application file for complete search history.

(56) References Cited

U.S. PATENT DOCUMENTS

| | | | | |
|---|---|---|---|---|
| 8,558,338 | B2 * | 10/2013 | Tsuji | H01L 27/14621 257/432 |
| 2001/0026322 | A1 * | 10/2001 | Takahashi | H04N 5/2254 348/340 |
| 2006/0027732 | A1 * | 2/2006 | Ahn | 250/208.1 |
| 2006/0187553 | A1 * | 8/2006 | Tanaka et al. | 359/619 |
| 2009/0035887 | A1 | 2/2009 | Suzuki et al. | |
| 2009/0242735 | A1 * | 10/2009 | Masuyama | H01L 27/14632 250/208.1 |
| 2009/0255566 | A1 * | 10/2009 | Wang | 136/246 |
| 2010/0059844 | A1 * | 3/2010 | Tanaka | 257/432 |
| 2010/0207225 | A1 | 8/2010 | Masuda | |

(Continued)

FOREIGN PATENT DOCUMENTS

| | | |
|---|---|---|
| JP | 2000-36587 A | 2/2000 |
| JP | 2006-324354 A | 11/2006 |
| JP | 2009-141192 A | 6/2009 |
| JP | 2011-142234 A | 7/2011 |
| TW | 200945569 | 11/2009 |

OTHER PUBLICATIONS

Office Action of corresponding JP patent application No. 2014-194576 issued on Dec. 14, 2015 with English language translation (8 pgs.).

(Continued)

*Primary Examiner* — Marc Armand
*Assistant Examiner* — Younes Boulghassoul
(74) *Attorney, Agent, or Firm* — Muncy, Geissler, Olds & Lowe, P.C.

(57) ABSTRACT

A solid-state imaging device is provided. The solid-state imaging device includes a substrate containing a plurality of photoelectric conversion elements. A color filter layer is disposed above the photoelectric conversion elements. A light shielding layer is disposed between the color filter layer and substrate. The light-shielding layer has a plurality of first light shielding partitions extended along a first direction and a plurality of second light shielding partitions extended along a second direction perpendicular to the first direction. The first light shielding partitions have different dimensions along the second direction and the second light shielding partitions have different dimensions along the first direction.

20 Claims, 6 Drawing Sheets

(56) References Cited

U.S. PATENT DOCUMENTS

| | | |
|---|---|---|
| 2010/0282945 A1 | 11/2010 | Yokogawa |
| 2011/0139968 A1* | 6/2011 | Cheung .................... G01J 1/06 250/216 |
| 2011/0241145 A1 | 10/2011 | Lenchenkov |
| 2012/0007204 A1 | 1/2012 | Hsu et al. |
| 2015/0108598 A1* | 4/2015 | Kambe ............. H01L 27/14603 257/432 |

OTHER PUBLICATIONS

Office Action its corresponding TW patent application No. 103127725 issued on Dec. 23, 2015 with the search report (6 pgs.).

* cited by examiner

SOLID-STATE IMAGING DEVICES HAVING LIGHT SHIELDING PARTITIONS WITH VARIABLE DIMENSIONS

BACKGROUND OF THE INVENTION

1. Field of the Invention

The invention relates to imaging devices, and more particularly to a light-shielding structure of solid-state imaging devices.

2. Description of the Related Art

Solid-state image devices, for example charge-coupled device (CCD) image sensors or complementary metal-oxide semiconductor (CMOS) image sensors, have been widely used in various image-capturing apparatuses, for example digital still cameras, digital video cameras and the like. In solid-state imaging devices, multiple pixels are arrayed on a semiconductor substrate such as a silicon chip. Each pixel has a photoelectric transducer such as a photodiode, which generates a signal charge by performing photoelectric conversion of incident light received by the photodiode. Signal charges corresponding to photoelectrons generated in the photodiodes are obtained by a CCD-type or a CMOS-type reading circuit.

Solid-state imaging devices are roughly classified into two groups in terms of the direction of light incident on a light receiving unit. One is front-side illuminated (FSI) imaging devices that receive light incident on the front side of a semiconductor substrate on which a wiring layer of the reading circuit is formed. The other is back-side illuminated (BSI) imaging devices that receive light incident on the back side of a semiconductor substrate on which no wiring layer is formed. For imaging a color image, a color filter is provided in the FSI and BSI imaging devices. The FSI and BSI imaging devices usually have a light shielding layer for blocking light between pixels to prevent color mixture.

BRIEF SUMMARY OF THE INVENTION

Incident light radiates onto a solid-state imaging device with a chief ray angle (CRA). When an oblique incident light radiates onto a solid-state imaging device, the solid-state imaging device has a CRA larger than that of a normal incident light. When a solid-state imaging device receives incident light with a large CRA, cross-talk between adjacent pixels of the solid-state imaging device is worse. Besides, cross-talk between adjacent pixels at an edge of a pixel array of a solid-state imaging device is worse than that at the center of the pixel array of the solid-state imaging device.

According to embodiments of the disclosure, various light shielding layer structure designs of solid-state imaging devices are provided to reduce or prevent the above-mentioned cross-talk issues caused by an oblique incident light and at the edge of the pixel array of the solid-state imaging devices.

In some embodiments, a solid-state imaging device is provided. The solid-state imaging device includes a substrate containing a plurality of photoelectric conversion elements. The solid-state imaging device also includes a color filter layer disposed above the photoelectric conversion elements. The solid-state imaging device further includes a light shielding layer disposed between the color filter layer and substrate. The light-shielding layer has a plurality of first light shielding partitions extended along a first direction and a plurality of second light shielding partitions extended along a second direction perpendicular to the first direction. The first light shielding partitions have different dimensions along the second direction and the second light shielding partitions have different dimensions along the first direction.

In some embodiments, a solid-state imaging device is provided. The solid-state imaging device includes a substrate containing a plurality of photoelectric conversion elements. The solid-state imaging device also includes a color filter layer disposed above the photoelectric conversion elements. The solid-state imaging device further includes a light shielding layer disposed between the color filter layer and the substrate. The light shielding layer has a plurality of first light shielding partitions extended along a first direction and a plurality of second light shielding partitions extended along a second direction perpendicular to the first direction. Each distance between two adjacent first light shielding partitions is different along the second direction and each distance between two adjacent second light shielding partitions is different along the first direction. In addition, the solid-state imaging device includes a microlens structure disposed above the color filter layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense. The scope of the invention is best determined by reference to the appended claims.

Figure 1:
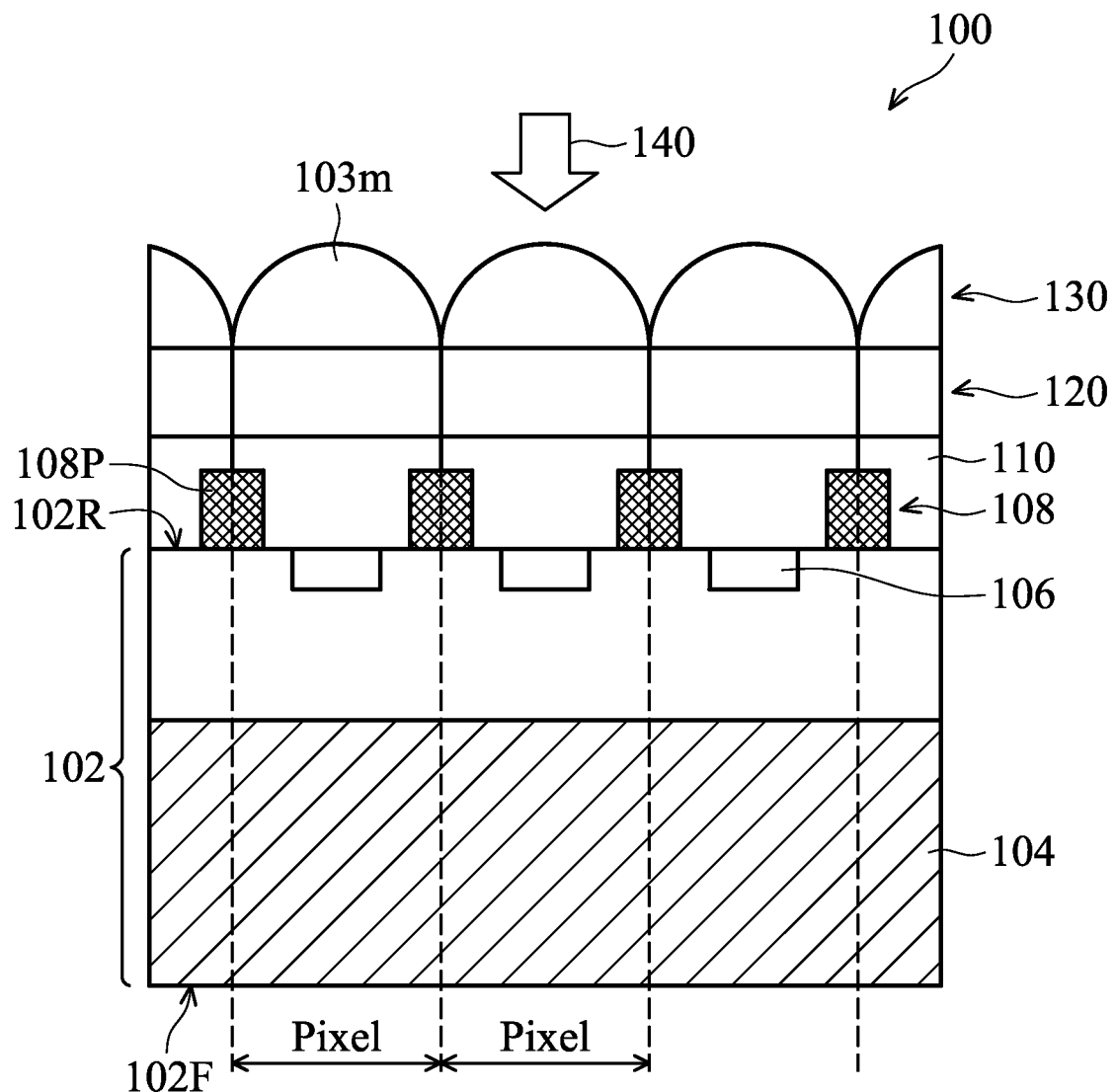
FIG. 1 shows a schematic partial cross section of a solid-state imaging device according to some embodiments of the disclosure.

Referring to FIG. 1, a cross section of a solid-state imaging device 100 according to some embodiments is shown. The solid-state imaging device 100 may be formed of a complementary metal-oxide semiconductor (CMOS) image sensor or a charge coupled device (CCD) image sensor. The solid-state imaging device 100 includes a substrate 102, for example, a semiconductor substrate having a front surface 102F and a rear surface 102R. The semiconductor substrate may be a wafer or a chip. The solid-state imaging device 100 also includes a plurality of photoelectric conversion elements 106, such as photodiodes formed in the substrate 102. The photoelectric conversion elements 106 are referred to as photodiodes 106 thereafter. Each of the photodiodes 106 is disposed in one respective pixel of the solid-state imaging device 100 and the photodiodes 106 are isolated from each other. Although FIG. 1 shows three pixels, actually the solid-state imaging device 100 has several million or more pixels.

In some embodiments, the photodiodes 106 are formed on the rear surface 102R of the substrate 102. A wiring layer 104 including various wiring lines and electronic circuits required for the solid-state imaging device 100 is formed on the front surface 102F of the substrate 102. Incident light 140 radiates the rear surface 102R of the substrate 102 and is received by the photodiodes 106. Therefore, the solid-state imaging device 100 as shown in FIG. 1 is referred to as a BSI imaging device.

In some other embodiments, the solid-state imaging device is a FSI imaging device. Incident light radiates the front surface of the substrate, passes through the wiring layer and is received by the photodiodes. Because the path of incident light passing through an FSI imaging device to reach the photodiodes is farther than that of a BSI imaging device, the optical cross-talk effect of the FSI imaging devices is smaller than that of the BSI imaging devices.

As shown in FIG. 1, in the BSI imaging device 100, the incident light 140 radiates the rear surface 102R of the semiconductor substrate 102 to reach the photodiodes 106 without passing the wiring layer 104 formed on the front surface 102F of the semiconductor substrate 102. Therefore, the optical cross-talk occurs more easily between adjacent pixels in BSI imaging devices than in FSI imaging devices.

Generally, the incident light 140 radiates the center and an edge of the solid-state imaging devices 100 at different angles. The incident light 140 radiates the edge of the solid-state imaging devices 100 at an oblique incident angle. The incident light 140 radiates the center of the solid-state imaging devices 100 at a normal incident angle. When the solid-state imaging device 100 receives an oblique incident light 140 at a large chief ray angle (CRA), cross-talk between adjacent pixels of the solid-state imaging devices 100 is worse. Therefore, in solid-state imaging devices 100, cross-talk between adjacent pixels at the edges of the pixel array of the solid-state imaging device is worse than cross-talk occurring at the center of the pixel array of the solid-state imaging device.

According to embodiments of the disclosure, the solid-state imaging device 100 includes a light shielding layer 108 formed on the rear surface 102R of the semiconductor substrate 102 to reduce or prevent the cross-talk issue caused by an oblique incident light and the cross-talk issue occurring at the edge of the pixel array of the solid-state imaging device 100. As shown in FIG. 1, the dimensional relation of different portions of the light shielding layer 108 is not drawn to scale. The detail of the different portions of the light shielding layer 108 in dimension design will be described hereafter. In some embodiments, the material of the light shielding layer 108 is a high dielectric-constant (k) material, such as high-k materials with a dielectric constant greater than 4.2. The high-k material can be selected from W, AlCu, $Ta_2O_5$ and other high-k materials suitable for light shielding.

The solid-state imaging devices 100 also include a passivation layer 110 formed on the rear surface 102R of the semiconductor substrate 102 and covering the light shielding layer 108. The passivation layer 110 has a flat surface. The material of the passivation layer 110 includes silicon oxides, silicon nitrides, silicon oxynitrides or other suitable insulating materials. The solid-state imaging devices 100 further include a color filter layer 120 formed on the flat surface of the passivation layer 110. In some embodiments, the color filter layer 120 includes a plurality of color filter components, such as a three-primary-color of red (R), green (G) and blue (B) color filter components arrayed by a suitable arrangement. In some other embodiments, the color filter layer 120 further includes white (W) color filter components arrayed with R, G and B color filter components together in a suitable arrangement.

In addition, the solid-state imaging devices 100 include a microlens structure 130 disposed above the color filter layer 120. The microlens structure 130 has a plurality of microlens elements 130m arranged into an array. The microlens structure 130 is provided to efficiently radiate the incident light 140 onto the photodiodes 106. In some embodiments, a chemical vapor deposition (CVD) oxide thin-film (not shown) is further deposited on the surface of the microlens structure 130. The material of the CVD thin film includes silicon oxide, silicon nitride or a combination thereof.

The light shielding layer 108 includes a plurality of light shielding partitions 108P disposed between the photodiodes 106. From a top view, the light shielding partitions 108P constitute a grid structure. The photodiodes 106 are disposed in openings of the grid structure and arranged into an array. According to some embodiments, the dimensions of the light shielding partitions 108P, such as the widths and the heights, are adjusted to reduce or prevent cross-talk between adjacent pixels caused by an oblique angle of incident light and cross-talk occurring at the edge of the pixel array of the solid-state imaging devices.

Figure 2:
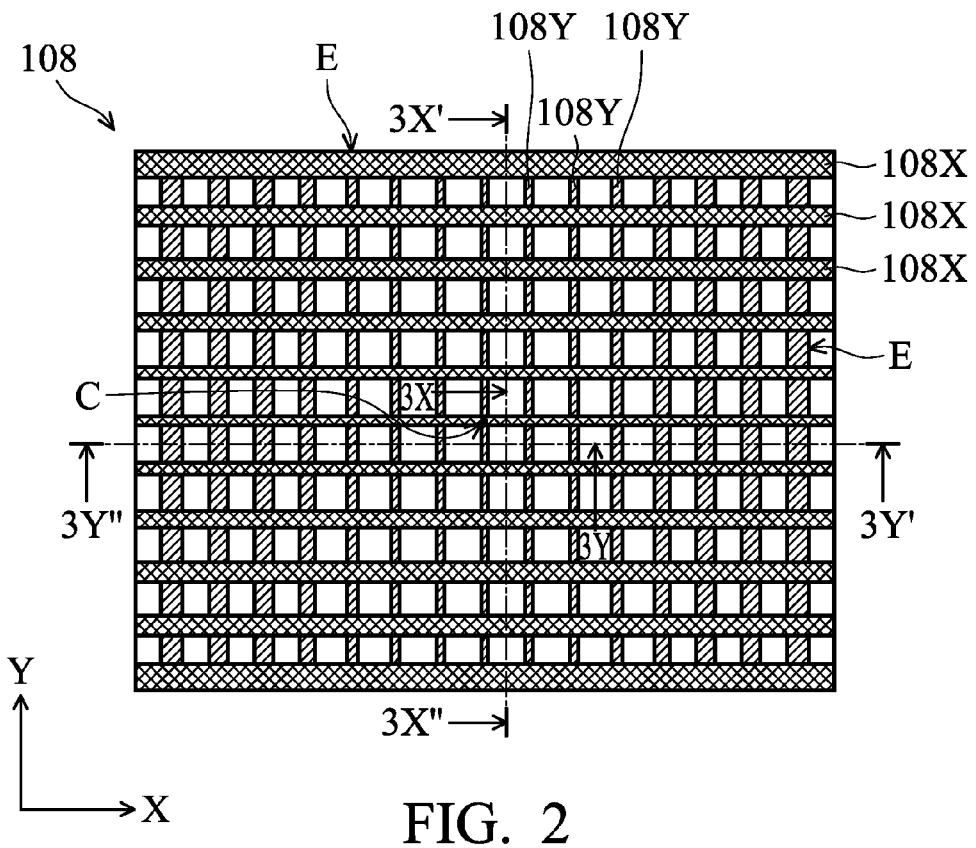
FIG. 2 shows a schematic plane view of a light shielding layer of a solid-state imaging device according to some embodiments of the disclosure.

FIG. 2 is a plane view of a light shielding layer 108 of a solid-state imaging device 100 in accordance with some embodiments. The light shielding layer 108 includes a plurality of first light shielding partitions 108X extending along a first direction, such as an X-axial direction. The light shielding layer 108 also includes a plurality of second light shielding partitions 108Y extending along a second direction, such as a Y-axial direction. The second direction is perpendicular to the first direction. Therefore, the first light shielding partitions 108X are perpendicular to the second light shielding partitions 108Y to form a grid structure. In some embodiments, the first light shielding partitions 108X have different dimensions along the second direction, i.e. the Y-axial direction. The second light shielding partitions 108Y also have different dimensions along the first direction, i.e. the X-axial direction.

Figure 3:
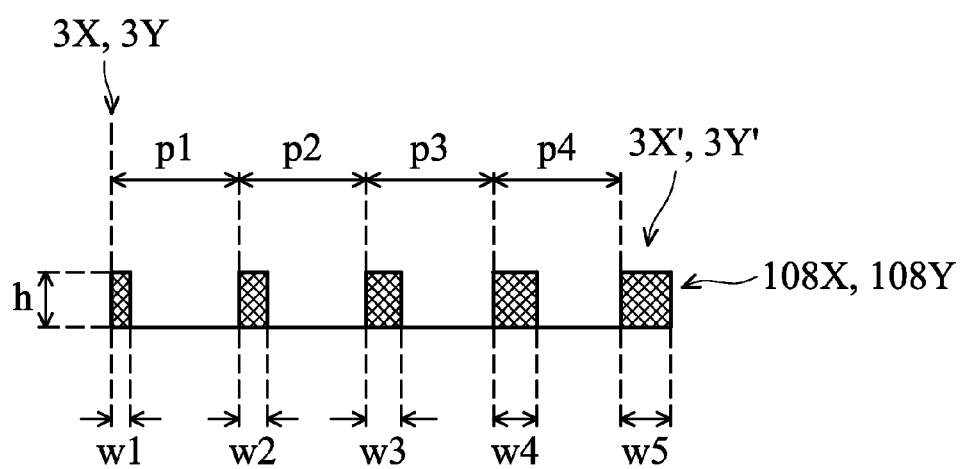
FIG. 3 shows a schematic partial cross section of a light shielding layer of a solid-state imaging device, along a cross-sectional line 3X-3X' or 3Y-3Y' of FIG. 2, according to some embodiments of the disclosure.

FIG. 3 is a partial cross section of a light shielding layer 108 of a solid-state imaging device 100, along a cross-sectional line 3X-3X' or 3Y-3Y' of FIG. 2, in accordance with some embodiments. As shown in FIG. 3, the first light shielding partitions 108X have different widths w1, w2, w3, w4 and w5 along the cross-sectional line 3X-3X'. The widths w1-w5 of the first light shielding partitions 108X gradually increase along the cross-sectional line 3X-3X'. In other words, the widths of the first light shielding partitions 108X gradually increase from a center C to an edge E (as shown in FIG. 2) of the light shielding layer 108. In some embodiments, each height h of the first light shielding partitions 108X along the cross-sectional line 3X-3X' is equal. In other words, the heights of the first light shielding partitions 108X are equal from the center C to the edge E of the light shielding layer 108. In addition, the center C and the edges E of the light shielding layer 108 correspond to the center and the edges of the solid-state imaging device 100.

Furthermore, pitches p1, p2, p3 and p4 of the first light shielding partitions 108X along the cross-sectional line 3X-3X' are equal. In other words, the first light shielding partitions 108X of the light shielding layer 108 are arranged with the same pitch in the solid-state imaging device 100.

In the embodiments, the second light shielding partitions 108Y are designed in the same way as the first light shielding partitions 108X. As shown in FIG. 3, the second light shielding partitions 108Y have different widths w1, w2, w3, w4 and w5 along the cross-sectional line 3Y-3Y'. The widths w1-w5 of the second light shielding partitions 108Y gradually increase along the cross-sectional line 3Y-3Y'. In other words, the widths of the second light shielding partitions 108Y gradually increase from the center C to the edges E (as shown in FIG. 2) of the light shielding layer 108 in the solid-state imaging device 100. In some embodiments, each height h of the second light shielding partitions 108Y is equal along the cross-sectional line 3Y-3Y'. In other words, the heights of the second light shielding partitions 108Y are equal from the center C to the edges E of the light shielding layer 108 in the solid-state imaging device 100.

Moreover, pitches p1, p2, p3 and p4 of the second light shielding partitions 108Y are equal along the cross-sectional line 3Y-3Y'. In other words, the second light shielding partitions 108Y are arranged with the same pitch in the solid-state imaging device 100.

In the embodiments, the widths of the first and second light shielding partitions 108X and 108Y gradually increase from the center to the edges of the solid-state imaging device 100. Moreover, all of the first and second light shielding partitions 108X and 108Y have the same height. In addition, the first and second light shielding partitions 108X and 108Y are arranged with the same pitch in the solid-state imaging device.

An oblique incident light radiating onto the solid-state imaging device 100 can be more effectively blocked by a wide light shielding partition than a narrow light shielding partition. According to the embodiments, the light shielding layer 108 having the wider light shielding partitions disposed at the edges of the solid-state imaging device 100 can effectively block an oblique incident light radiating onto the edges of the solid-state imaging device 100. Therefore, a cross-talk issue caused by an oblique incident light and a worse cross-talk issue occurring at the edges of the solid-state imaging device 100 are overcome by the width design of the light shielding layer in the embodiments.

Figure 4:
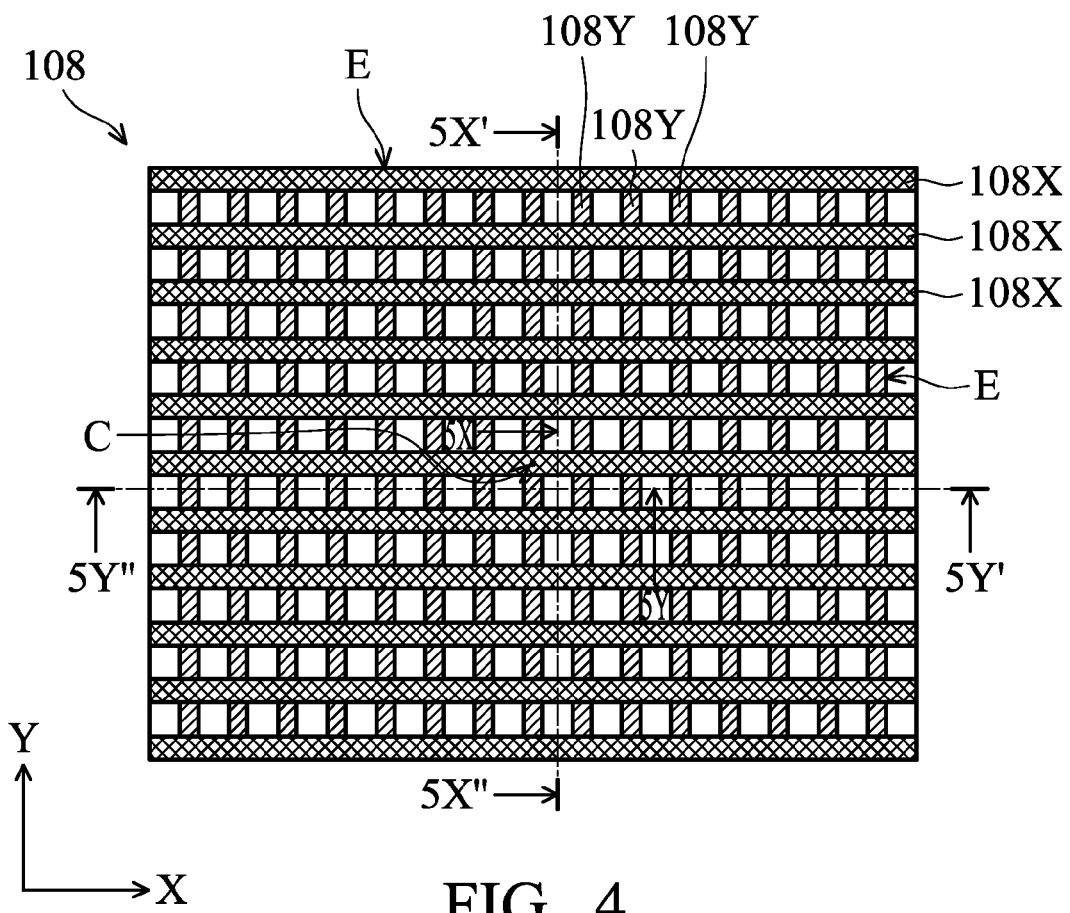
FIG. 4 shows a schematic plane view of a light shielding layer of a solid-state imaging device according to some embodiments of the disclosure.

FIG. 4 is a plane view of a light shielding layer 108 of a solid-state imaging device 100 in accordance with some embodiments. As shown in FIG. 4, the first and second light shielding partitions 108X and 108Y of the light shielding layer 108 have the same width.

Figure 5:
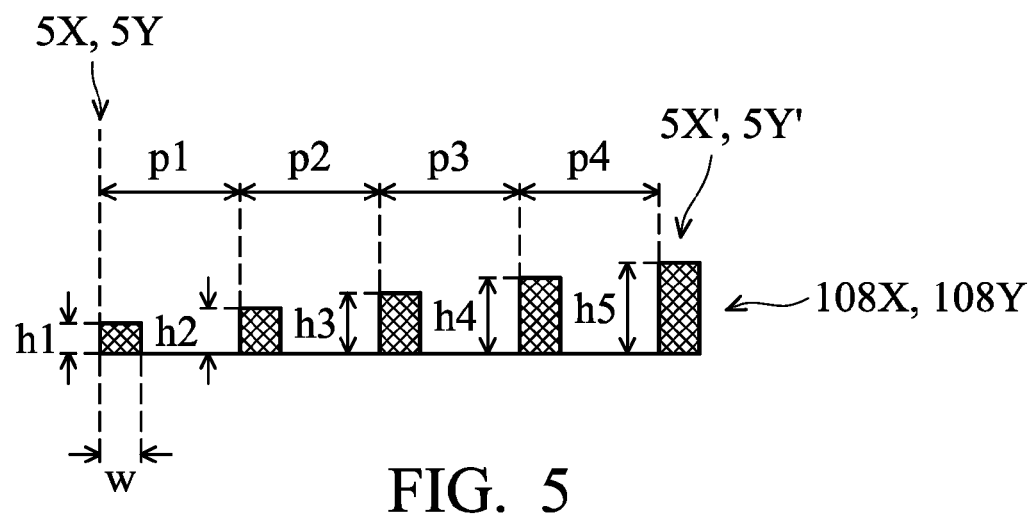
FIG. 5 shows a schematic partial cross section of a light shielding layer of a solid-state imaging device, along a cross-sectional line 5X-5X' or 5Y-5Y' of FIG. 4, according to some embodiments of the disclosure.

FIG. 5 is a partial cross section of a light shielding layer 108 of a solid-state imaging device 100, along a cross-sectional line 5X-5X' or 5Y-5Y' of FIG. 4, in accordance with some embodiments. As shown in FIG. 5, heights h1, h2, h3, h4 and h5 of the first light shielding partitions 108X along the cross-sectional line 5X-5X' are different from each other. The heights h1-h5 of the first light shielding partitions 108X gradually increase along the cross-sectional line 5X-5X'. In other words, the heights of the first light shielding partitions 108X gradually increase from a center C to an edge E of the light shielding layer 108 in the solid-state imaging device 100.

Moreover, pitches p1, p2, p3 and p4 between two adjacent first light shielding partitions 108X along the cross-sectional line 5X-5X' are equal. In other words, the first light shielding partitions 108X are arranged with the same pitch in the solid-state imaging device.

In the embodiments, the second light shielding partitions 108Y are designed in the same way as the first light shielding partitions 108X. As shown in FIG. 5, the heights h1-h5 of the second light shielding partitions 108Y along the cross-sectional line 5Y-5Y' are different from each other. The heights h1-h5 of the second light shielding partitions 108Y gradually increase along the cross-sectional line 5Y-5Y'. In other words, the heights of the second light shielding partitions 108Y gradually increase from a center C to an edge E (as shown in FIG. 4) of the light shielding layer 108 in the solid-state imaging device 100.

Moreover, pitches p1-p4 between two adjacent second light shielding partitions 108Y along the cross-sectional line 5Y-5Y' are equal. In other words, the second light shielding partitions 108Y are arranged with the same pitch in the solid-state imaging device 100.

In the embodiments, the heights of the first and second light shielding partitions 108X and 108Y gradually increase from the center to the edges of the solid-state imaging device 100. Moreover, all of the first and second light shielding partitions 108X and 108Y have the same width. In addition, the first and second light shielding partitions 108X and 108Y are arranged with the same pitch in the solid-state imaging device 100.

An oblique incident light radiating onto the solid-state imaging device 100 can be more effectively blocked by a high light shielding partition than a low light shielding partition. According to the embodiments, the light shielding layer 108 with the higher light shielding partitions disposed at the edges of the solid-state imaging device 100 can effectively block an oblique incident light radiating onto the edges of the solid-state imaging device 100. Therefore, a cross-talk issue caused by an oblique incident light and a worse cross-talk issue occurring at the edges of the solid-state imaging device 100 are overcome by the height design of the light shielding layer in the embodiments.

Figure 6:
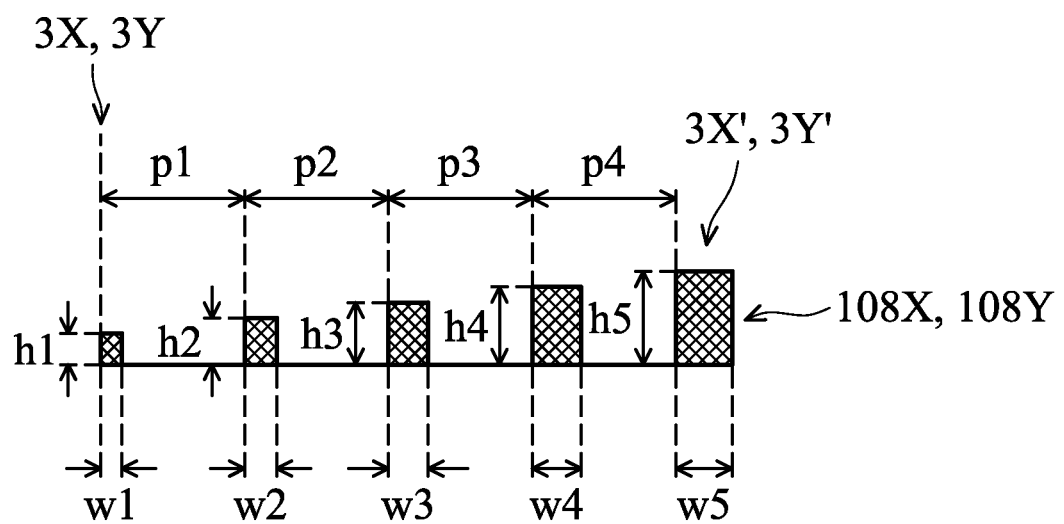
FIG. 6 shows a schematic partial cross section of a light shielding layer of a solid-state imaging device, along a cross-sectional line 3X-3X' or 3Y-3Y' of FIG. 2, according to some embodiments of the disclosure.

FIG. 6 is a partial cross section of a light shielding layer 108 of a solid-state imaging device 100, along a cross-sectional line 3X-3X' or 3Y-3Y' of FIG. 2, in accordance with some embodiments. As shown in FIG. 6, widths w1, w2, w3, w4 and w5 of the first light shielding partitions 108X are different from each other and gradually increase along the cross-sectional line 3X-3X'. Moreover, heights h1, h2, h3, h4 and h5 of the first light shielding partitions 108X are different from each other and gradually increase along the cross-sectional line 3X-3X'. In other words, the widths and heights of the first light shielding partitions 108X gradually increase from the center C to the edges E of the light shielding layer 108 in the solid-state imaging device 100.

Moreover, pitches p1, p2, p3, p4 between two adjacent first light shielding partitions 108X along the cross-sectional line 3X-3X' are equal. In other words, the first light shielding partitions 108X are arranged with the same pitch in the solid-state imaging device 100.

In the embodiments, the second light shielding partitions 108Y are designed in the same way as the first light shielding partitions 108X. As shown in FIG. 6, widths w1, w2, w3, w4 and w5 of the second light shielding partitions 108Y are different from each other and gradually increase along the cross-sectional line 3Y-3Y'. Moreover, heights h1, h2, h3, h4 and h5 of the second light shielding partitions 108Y are different from each other and gradually increase along the cross-sectional line 3Y-3Y'. In other words, the widths and the heights of the second light shielding partitions 108Y gradually increase from the center C to the edge E of the light shielding layer 108 in the solid-state imaging device 100.

In addition, pitches p1, p2, p3, p4 between two adjacent second light shielding partitions 108Y along the cross-sectional line 3Y-3Y' of FIG. 2 are equal. In other words, the second light shielding partitions 108Y are arranged with the same pitch in the solid-state imaging device 100.

In the embodiments, the widths and the heights of the first and second light shielding partitions 108X and 108Y gradually increase from the center to the edges of the solid-state imaging device 100. Moreover, the first and second light shielding partitions 108X and 108Y are arranged with the same pitch in the solid-state imaging device 100.

An oblique incident light radiating onto the solid-state imaging device 100 can be more effectively blocked by a wide and high light shielding partition than a narrow and low light shielding partition. According to the embodiments, the light shielding layer 108 having the wider and higher light shielding partitions disposed at the edges of the solid-state imaging device 100 can effectively block an oblique incident light radiating onto the edges of the solid-state imaging device 100. Therefore, a cross-talk issue caused by an oblique incident light and a worse cross-talk issue occurring at the edges of the solid-state imaging device 100 are more effectively overcome by the width and height design of the light shielding layer in the embodiments.

Figure 7:
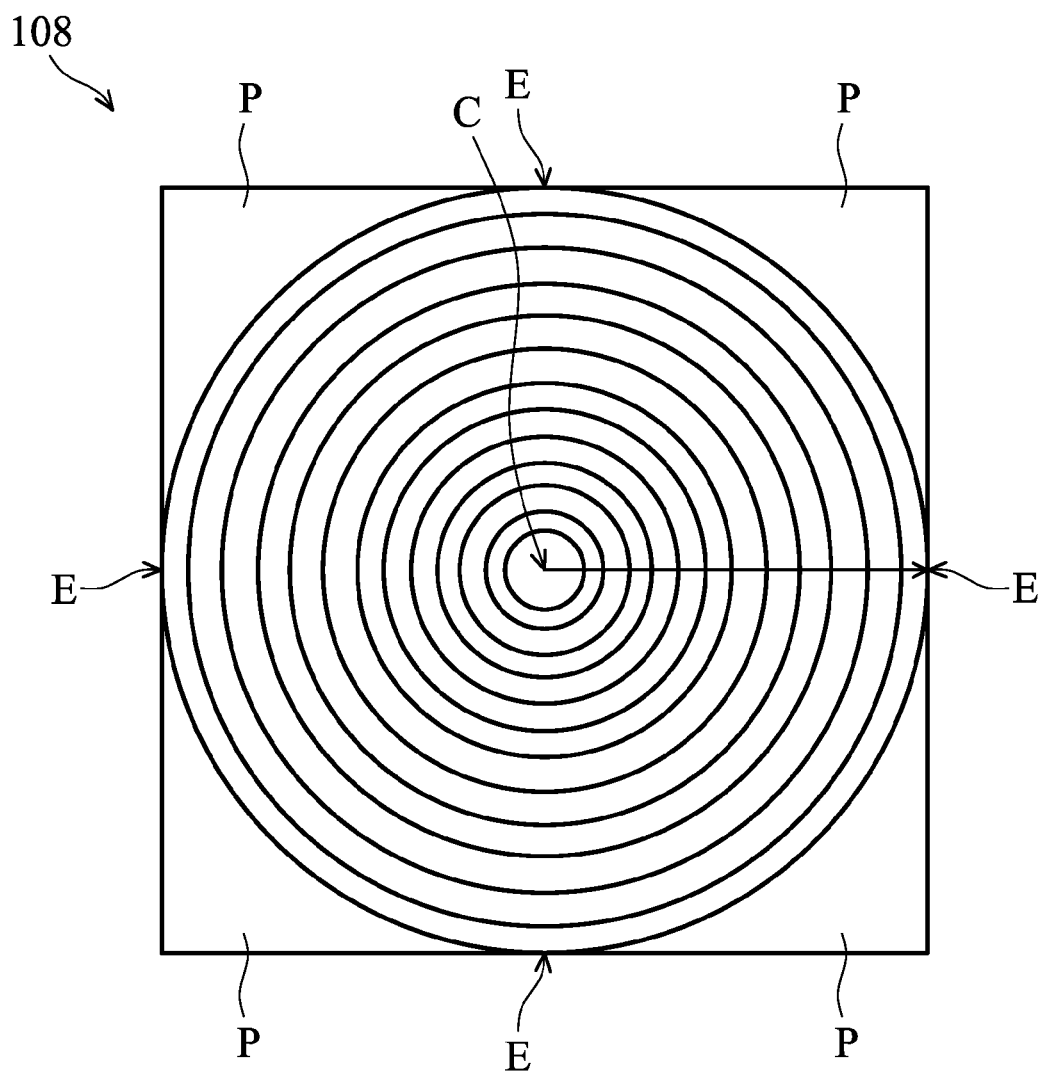
FIG. 7 shows multiple concentric circles, each circle representing the portions of a light shielding layer with equal width, equal height or equal width and height according to some embodiments of the disclosure.

In some embodiments, each strip of the first and second light shielding partitions 108X and 108Y does not have the same width, the same height or the same width and height along an extending direction of the strip. The widths, the heights, or the widths and heights of the first and second light shielding partitions 108X and 108Y gradually increase from the center to the edges of the solid-state imaging device 100. FIG. 7 shows multiple concentric circles drawn on a light shielding layer 108 of a solid-state imaging device 100 in accordance with some embodiments. Each circle of FIG. 7 represents the portions of the first and second light shielding partitions 108X and 108Y having equal width, equal height or equal width and height. As shown in FIG. 7, the center C of the light shielding layer 108 has the smallest width, the smallest height or the smallest width and height. The edges E and the corner portions P of the light shielding layer 108 have the greatest width, the greatest height or the greatest width and height.

According to the embodiments, the edges E and the corner portions P of the light shielding layer 108 having the widest and highest light shielding partitions can effectively block an oblique incident light radiating onto the edges of the solid-state imaging device 100. Therefore, a cross-talk issue caused by an oblique incident light and a worse cross-talk issue occurring at the edges of the solid-state imaging device 100 are more effectively overcome by the design of the light shielding layer 108 in the embodiments.

Figure 8:
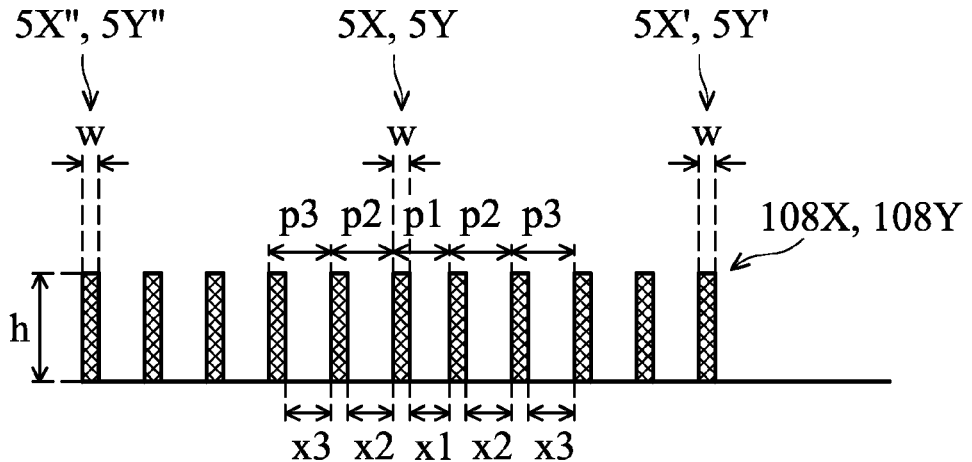
FIGS. 8-9 shows schematic partial cross sections of a light shielding layer of a solid-state imaging device, along a cross-sectional line 5X"-5X-5X' or 5Y"-5Y-5Y' of FIG. 4, according to some embodiments of the disclosure.

FIG. 8 is a partial cross section of a light shielding layer 108 of a solid-state imaging device 100, along a cross-sectional line 5X"-5X-5X' or 5Y"-5Y-5Y' of FIG. 4, in accordance with some embodiments. As shown in FIG. 8, the first and second light shielding partitions 108X and 108Y have the same height h and the same width w. In the embodiment, each distance x1, x2, x3, etc. between two adjacent first shielding partitions 108X is different from each other along the cross-sectional line 5X"-5X and along the cross-sectional line 5X-5X'. In other words, each distance between two adjacent first shielding partitions 108X is different from each other along the second direction, for example the Y-axial direction. The second shielding partitions 108Y are designed in the same way as the first shielding partitions 108X. In the embodiment, each distance x1, x2, x3, etc. between two adjacent second shielding partitions 108Y is different from each other along the cross-sectional line 5Y"-5Y and along the cross-sectional line 5Y-5Y'. In other words, each distance between two adjacent second shielding partitions 108Y is different from each other along the first direction, for example the X-axial direction.

Therefore, each pitch p1, p2, p3, etc. between two adjacent first shielding partitions 108X is different from each other along the second direction of the Y-axial direction. Similarly, each pitch p1, p2, p3, etc. between two adjacent second shielding partitions 108Y is different from each other along the first direction of the X-axial direction.

In some embodiments, a variation in the distances x1, x2, x3, etc. of the first shielding partitions 108X along the second direction of the Y-axial direction is a non-linear variation, for example following an equation of $\cos(\theta)=f(x)$, wherein $\theta$ is a chief ray angle (CRA) of incident light radiating onto a pixel of the solid-state imaging device 100 and x is a distance between two adjacent first shielding partitions 108X in the pixel. Similarly, a variation in the distances x1, x2, x3, etc. of the second shielding partitions 108Y along the first direction of the X-axial direction is also a non-linear variation, for example following the equation of $\cos(\theta)=f(x)$.

As shown in FIG. 1, the solid-state imaging device 100 includes a microlens structure 130 disposed above the color filter layer 120. The microlens structure 130 has a plurality of microlens elements 130m arranged into an array. Each microlens element 130m corresponds to a respective photodiode 106. In some embodiments, each distance between two adjacent microlens elements 130m is different from each other along the first direction of the X-axial direction and the second direction of the Y-axial direction to enhance a light receiving efficiency of the solid-state imaging device 100.

In some embodiments, a variation in the distances of the microlens elements 130m along the first and second directions is a non-linear variation. When an oblique incident light radiates onto the solid-state imaging device 100, the variation in the distances of the microlens elements 130m can make the oblique incident light correspond to the photodiode 106 in the correct pixel. Therefore, the cross-talk issue of the solid-state imaging device 100 caused by the oblique incident light is overcome.

In some embodiments, the variations in the distances of the first and second shielding partitions 108X and 108Y along the first and second directions are adjusted to be consistent with the variations in the distances of the microlens elements 130m. Therefore, the cross-talk issue of the solid-state imaging device 100 caused by the oblique incident light is effectively reduced or prevented by the layout design of the first and second shielding partitions 108X and 108Y of the light shielding layer 108.

Figure 9:
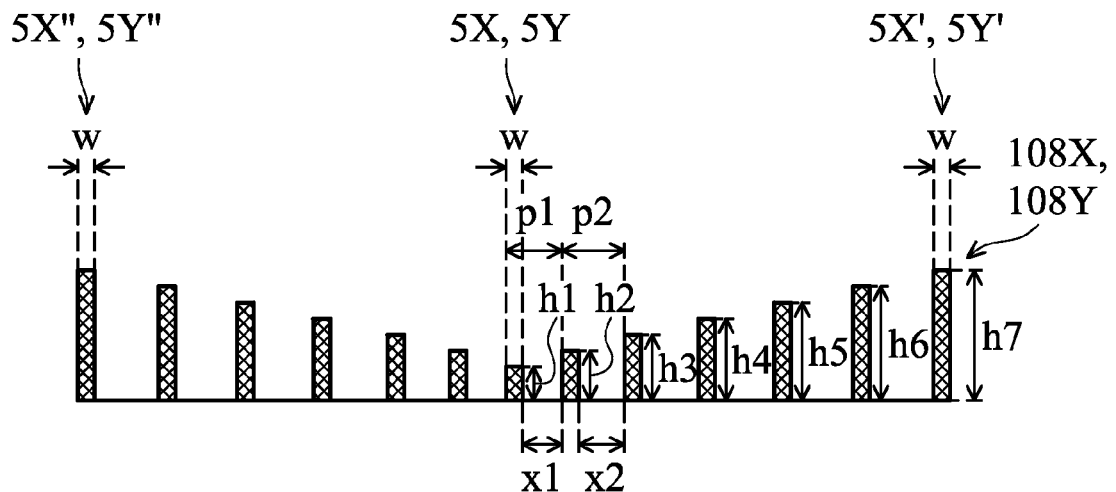

FIG. 9 is a partial cross section of a light shielding layer 108 of a solid-state imaging device 100, along a cross-sectional line 5X"-5X-5X' or 5Y"-5Y-5Y' of FIG. 4, in accordance with some embodiments. The difference between FIG. 9 and FIG. 8 is that the first light shielding partitions 108X have different heights h1-h7 along the second direction of the Y-axial direction and the second light shielding partitions 108Y have different heights h1-h7 along the first direction of the X-axial direction. The heights of the first and second light shielding partitions 108X and 108Y gradually increase from the center to the edges of the solid-state imaging device 100. Moreover, all of the first and second light shielding partitions 108X and 108Y have the same width w. In addition, the variations in the distances of the first and second shielding partitions 108X and 108Y along the first and second directions are non-linear variations consistent with a non-linear variation in the distances of the microlens elements 130m along the first and second directions.

According to the embodiments, the light shielding layer 108 having the higher light shielding partitions disposed at the edges of the solid-state imaging device 100 can more effectively block an oblique incident light radiating onto the edges of the solid-state imaging device 100. Furthermore, the variations in the distances of the first and second shielding partitions 108X and 108Y along the first and second directions are non-linear variations consistent with a non-linear variation in the distances of the microlens elements 130m along the first and second directions. Therefore, a cross-talk issue caused by an oblique incident light and a worse cross-talk issue occurring at the edges of the solid-state imaging device 100 are more effectively overcome by the layout and the height design of the light shielding layer 108 in the embodiments.

In some embodiments, the first and second shielding partitions 108X and 108Y of the light shielding layer 108 can be formed by a deposition, photolithography, and etching process or by a printing process.

According to the embodiments of the disclosure, the light-shielding layer has wider shielding partitions, higher shielding partitions or a combination thereof to reduce or prevent cross-talk caused by an oblique incident light radiating onto the solid-state imaging devices. Furthermore, the wider shielding partitions, the higher shielding partitions or a combination thereof are disposed at the edges of the solid-state imaging devices which can effectively reduce or prevent a worse cross-talk issue occurring at the edges of the solid-state imaging devices. The embodiments allow BSI imaging devices to overcome the cross-talk issue.

Moreover, in some embodiments of the disclosure, a layout of the shielding partitions of the light-shielding layer is adjusted to be consistent with a layout of the microlens elements which is designed to match an oblique incident light radiating onto the solid-state imaging devices. Therefore, a light receiving efficiency of the solid-state imaging devices is enhanced. Furthermore, the cross-talk issue caused by an oblique incident light radiating on the solid-state imaging devices is also overcome.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, comprising:
a substrate containing a plurality of photoelectric conversion elements;
a color filter layer disposed above the photoelectric conversion elements;
a passivation layer disposed below the color filter layer; and
a light shielding layer disposed between the color filter layer and the substrate, and having a plurality of first light shielding partitions extended along a first direction and a plurality of second light shielding partitions extended along a second direction perpendicular to the first direction,
wherein the first light shielding partitions have changing dimensions along the second direction and the second light shielding partitions have changing dimensions along the first direction, and
wherein the passivation layer has a thickness that is greater than a height of the light shielding layer.

2. The solid-state imaging device as claimed in claim 1, wherein the first light shielding partitions have different widths along the second direction, the second light shielding partitions have different widths along the first direction, and each pitch between two adjacent first or second light shielding partitions is equal.

3. The solid-state imaging device as claimed in claim 2, wherein the widths of the first and second light shielding partitions gradually increase from a center to an edge of the solid-state imaging device.

4. The solid-state imaging device as claimed in claim 3, wherein the first and second light shielding partitions have the same height.

5. The solid-state imaging device as claimed in claim 1, wherein the first light shielding partitions have different heights along the second direction, the second light shielding partitions have different heights along the first direction, and each pitch between two adjacent first or second light shielding partitions is equal.

6. The solid-state imaging device as claimed in claim 5, wherein the heights of the first and second light shielding partitions gradually increase from a center to an edge of the solid-state imaging device.

7. The solid-state imaging device as claimed in claim 6, wherein the first and second light shielding partitions have the same width.

8. The solid-state imaging device as claimed in claim 1, wherein the first light shielding partitions have different widths and different heights along the second direction, the second light shielding partitions have different widths and different heights along the first direction, and each pitch between two adjacent first or second light shielding partitions is equal.

9. The solid-state imaging device as claimed in claim 8, wherein the widths and the heights of the first and second light shielding partitions gradually increase from a center to an edge of the solid-state imaging device.

10. The solid-state imaging device as claimed in claim 1, wherein the substrate has a rear surface and a front surface opposite to the rear surface, the photoelectric conversion elements are formed on a rear surface of the substrate, incident light radiates the rear surface at a center and an edge of the solid-state imaging device at different angles, and the incident light radiates the edge of the solid-state imaging device at an oblique angle.

11. A solid-state imaging device, comprising:
a substrate containing a plurality of photoelectric conversion elements;
a color filter layer disposed above the photoelectric conversion elements;
a passivation layer disposed below the color filter layer;
a light shielding layer disposed between the color filter layer and the substrate, and having a plurality of first light shielding partitions extended along a first direction and a plurality of second light shielding partitions extended along a second direction perpendicular to the first direction; and
a microlens structure disposed above the color filter layer, wherein each distance from a center of the light shielding layer to an edge of the light shielding layer between two adjacent first light shielding partitions is different along the second direction and each distance from the center of the light shielding layer to the edge of the light shielding layer between two adjacent second light shielding partitions is different along the first direction, and wherein the passivation layer has a thickness that is greater than a height of the light shielding layer.

12. The solid-state imaging device as claimed in claim 11, wherein the first and second light shielding partitions has the same width.

13. The solid-state imaging device as claimed in claim 12, wherein each pitch of the first light shielding partitions is different along the second direction and each pitch of the second light shielding partitions is different along the first direction.

14. The solid-state imaging device as claimed in claim 13, wherein the first and second light shielding partitions have the same height.

15. The solid-state imaging device as claimed in claim 13, wherein the first light shielding partitions have different heights along the second direction and the second light shielding partitions have different heights along the first direction.

16. The solid-state imaging device as claimed in claim 15, wherein the heights of the first and second light shielding partitions gradually increase from a center to an edge of the solid-state imaging device.

17. The solid-state imaging device as claimed in claim 11, wherein the microlens structure has a plurality of microlens elements and each distance from the center of the light shielding layer to the edge of the light shielding layer between two adjacent microlens elements is different along the first direction and the second direction.

18. The solid-state imaging device as claimed in claim 17, wherein a variation in distances of the microlens elements from a center of the microlens elements to an edge of the microlens elements is a non-linear variation.

19. The solid-state imaging device as claimed in claim 18, wherein a variation in the distances of the first light shielding partitions from the center of the light shielding layer to the edge of the light shielding layer along the second direction is a non-linear variation and a variation in the distances of the second light shielding partitions from the center of the light shielding layer to the edge of the light shielding layer along the first direction is a non-linear variation.

20. The solid-state imaging device as claimed in claim 19, wherein the variation in the distances of the first light shielding partitions from the center of the light shielding layer to the edge of the light shielding layer and the variation in the distances of the second light shielding partitions from the center of the light shielding layer to the edge of the light shielding layer are consistent with the variation in the distances of the microlens elements from the center of the microlens elements to the edge of the microlens elements.

* * * * *